(12) United States Patent
Lian et al.

(10) Patent No.: US 8,408,285 B2
(45) Date of Patent: Apr. 2, 2013

(54) HEAT DISSIPATION APPARATUS

(75) Inventors: Zhi-Sheng Lian, Shenzhen (CN); Gen-Ping Deng, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 519 days.

(21) Appl. No.: 12/775,498

(22) Filed: May 7, 2010

(65) Prior Publication Data

US 2011/0114301 A1 May 19, 2011

(30) Foreign Application Priority Data

Nov. 19, 2009 (CN) .......................... 2009 1 0310022

(51) Int. Cl.
*H05K 7/20* (2006.01)
(52) U.S. Cl. .................. 165/185; 165/104.33; 165/121; 361/697; 361/700

(58) Field of Classification Search ............. 165/104.33, 165/80.3, 121, 185; 361/697, 700
See application file for complete search history.

(56) References Cited

U.S. PATENT DOCUMENTS

| 2,513,828 | A  | * | 7/1950 | Usselman et al. ............ 165/156 |
| 6,538,888 | B1 | * | 3/2003 | Wei et al. ...................... 361/697 |
| 6,575,231 | B1 | * | 6/2003 | Wu ................................ 361/697 |
| 6,712,128 | B1 | * | 3/2004 | Dussinger et al. ........... 165/80.3 |
| 7,055,577 | B2 | * | 6/2006 | Wang et al. ................... 165/80.3 |
| 7,128,135 | B2 | * | 10/2006 | Mok et al. ................. 165/104.33 |
| 7,273,091 | B2 | * | 9/2007 | Bahl et al. ................. 165/104.33 |
| 7,333,336 | B2 | * | 2/2008 | Kim ........................ 165/104.33 |
| 2005/0161199 | A1 | * | 7/2005 | Ma et al. .................. 165/104.33 |

* cited by examiner

*Primary Examiner* — Leonard R Leo
(74) *Attorney, Agent, or Firm* — Altis Law Group, Inc.

(57) ABSTRACT

A heat dissipation apparatus includes fins each including a body and blades extending radially outwardly from the body. The blades define cutouts therebetween. The fins are stacked together in such a manner that the cutouts of the fins cooperatively form airflow guiding channels each extending spirally from top to bottom.

10 Claims, 4 Drawing Sheets

HEAT DISSIPATION APPARATUS

BACKGROUND

1. Technical Field

The disclosure relates to a heat dissipation apparatus with airflow guiding channels for high heat dissipation efficiency.

2. Description of Related Art

With continuing developments in computer technology, many modern electronic devices such as central processing units (CPUs) operate at high speed. It is well known that when such electronic devices operate at high speed, they generate more heat than at low speed. If the heat is not dissipated efficiently, the stability of operation of the electronic device may be severely impacted. Generally, in order to ensure that the electronic device runs normally, a heat dissipation apparatus is used to dissipate the heat generated by the electronic device.

Conventionally, the heat dissipation apparatus includes a heat sink and a fan placed above the heat sink. The heat sink includes a solid cylindrical core thermally contacting the electronic device, and a plurality of fins extending radially and outwardly from a periphery of the core. In use, the core absorbs heat from the electronic device and transfers the heat to the fins around the core, while airflow generated from the fan moves downwardly to the fins to take the heat away. However, the flow direction of the air driven by the fan is not completely vertical and downward, but instead slightly spiralled according to the rotating direction of an impeller of the fan. This means that the air directly hits faces of the fins during the downward movement of the air. Thus, the air does not flow rapidly and smoothly along the fins, and the overall heat dissipating efficiency of the heat dissipation apparatus is thereby reduced.

What is needed, therefore, is a heat dissipation apparatus which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
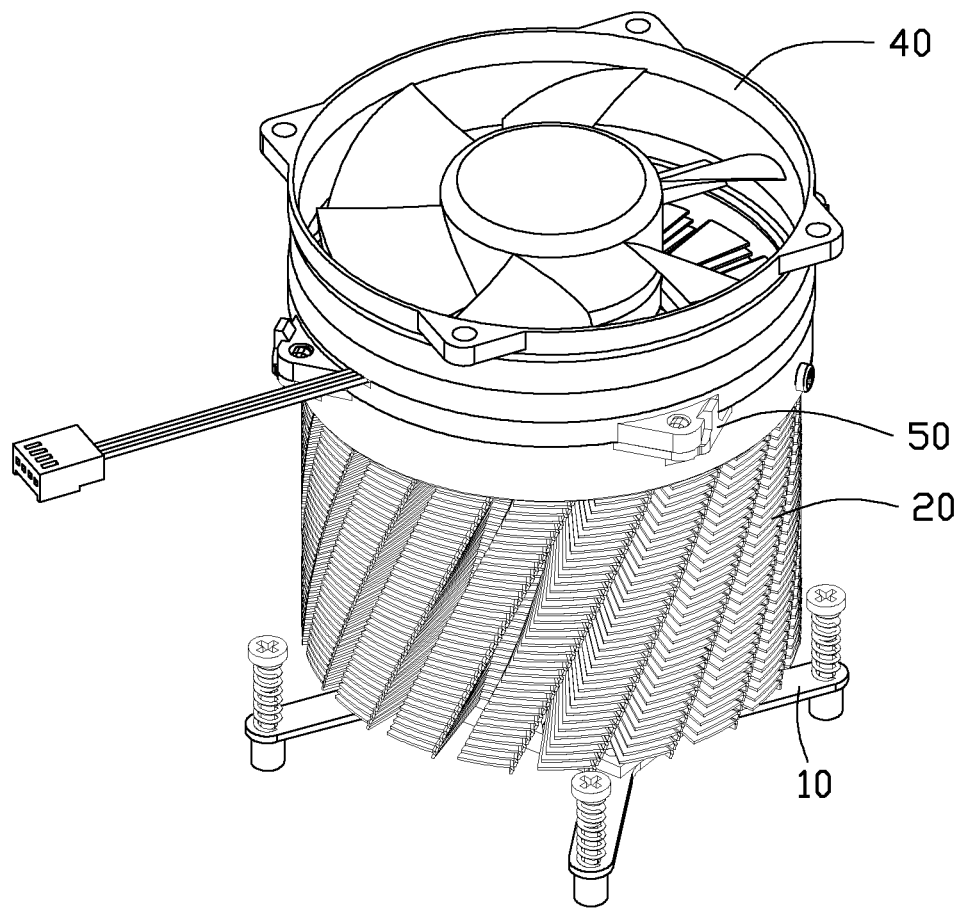
FIG. 1 is an isometric, assembled view of a heat dissipation apparatus in accordance with one embodiment of the disclosure.
Figure 2:
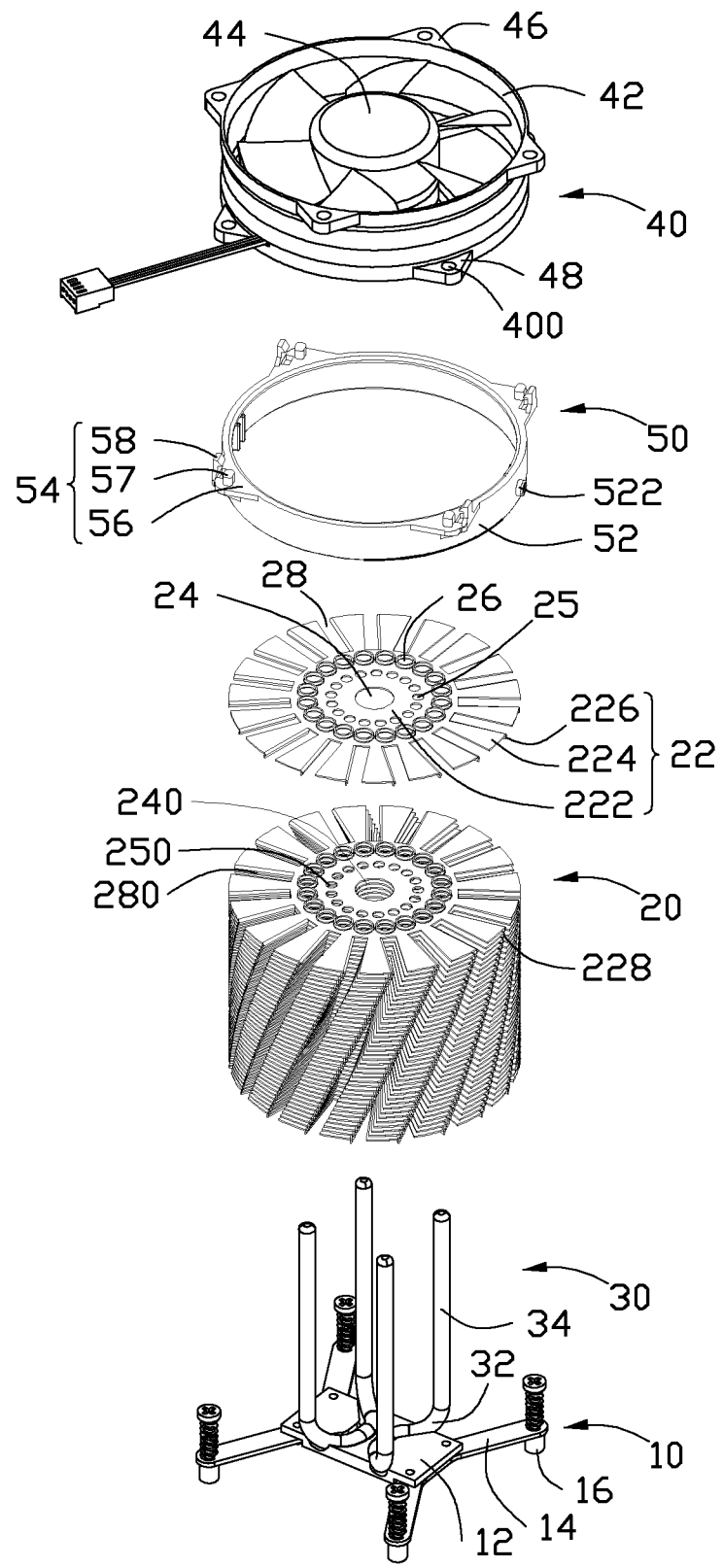
FIG. 2 is an exploded view of the heat dissipation apparatus of FIG. 1.

Referring to FIGS. 1-2, a heat dissipation apparatus in accordance with an embodiment of the disclosure is provided for cooling an electronic device (not shown) mounted on a printed circuit board (not shown). The heat dissipation apparatus includes a base 10, a fin assembly 20 placed above the base 10, two heat pipes 30 thermally connecting the base 10 with the fin assembly 20, a fan 40 placed above the fin assembly 20, and a holder 50 fixing the fan 40 on the fin assembly 20.

The base 10 includes a rectangular heat conducting plate 12, four mounting legs 14 attached at four corners of the heat conducting plate 12, and four fasteners 16 attached to the four mounting legs 14. The heat conducting plate 12 is made of metal such as aluminum, copper or an alloy thereof, and is for thermally contacting the electronic device. The heat conducting plate 12 defines two grooves (not labeled) in a top surface thereof. The fasteners 16 can extend through the printed circuit board to thereby fasten the heat dissipation apparatus on the printed circuit board.

Figure 3:
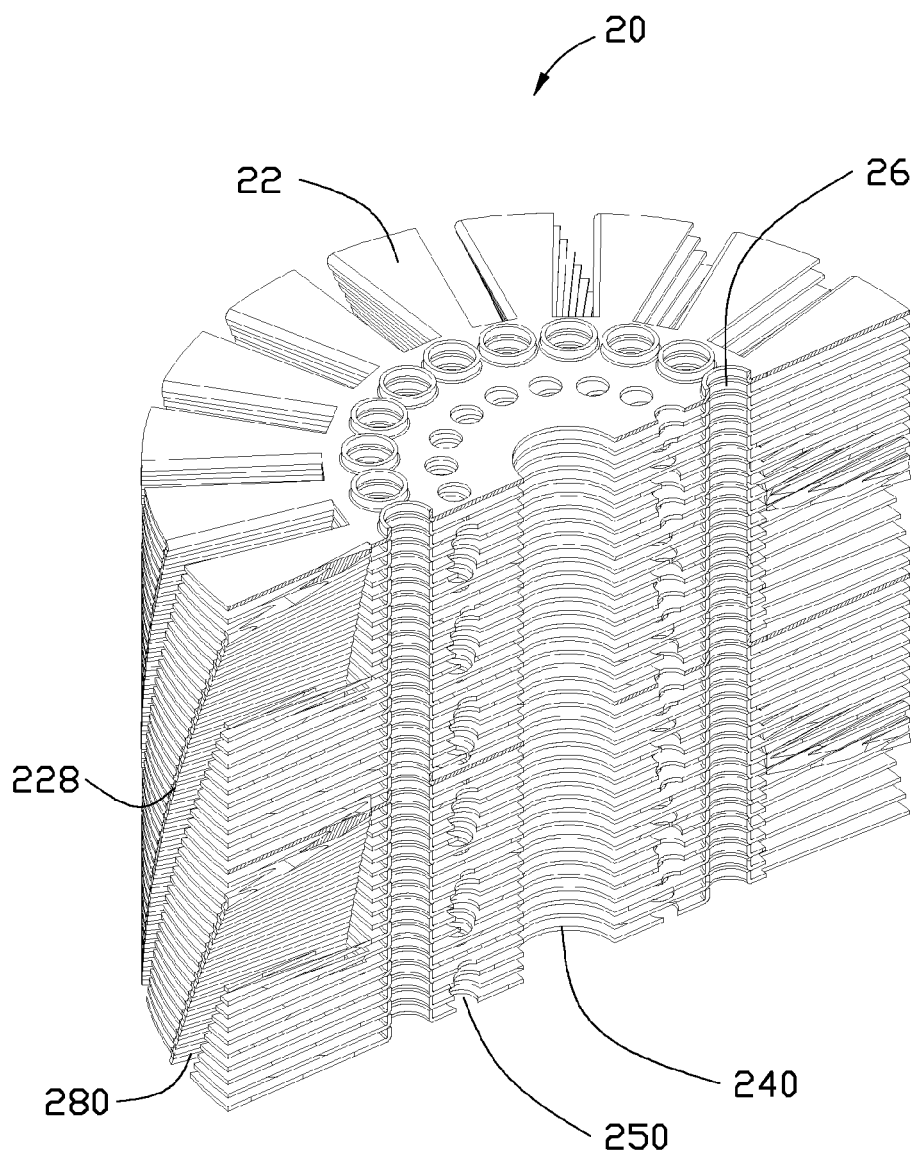
FIG. 3 is a cutaway view of a fin assembly of the heat dissipation apparatus of FIG. 1.
Figure 4:
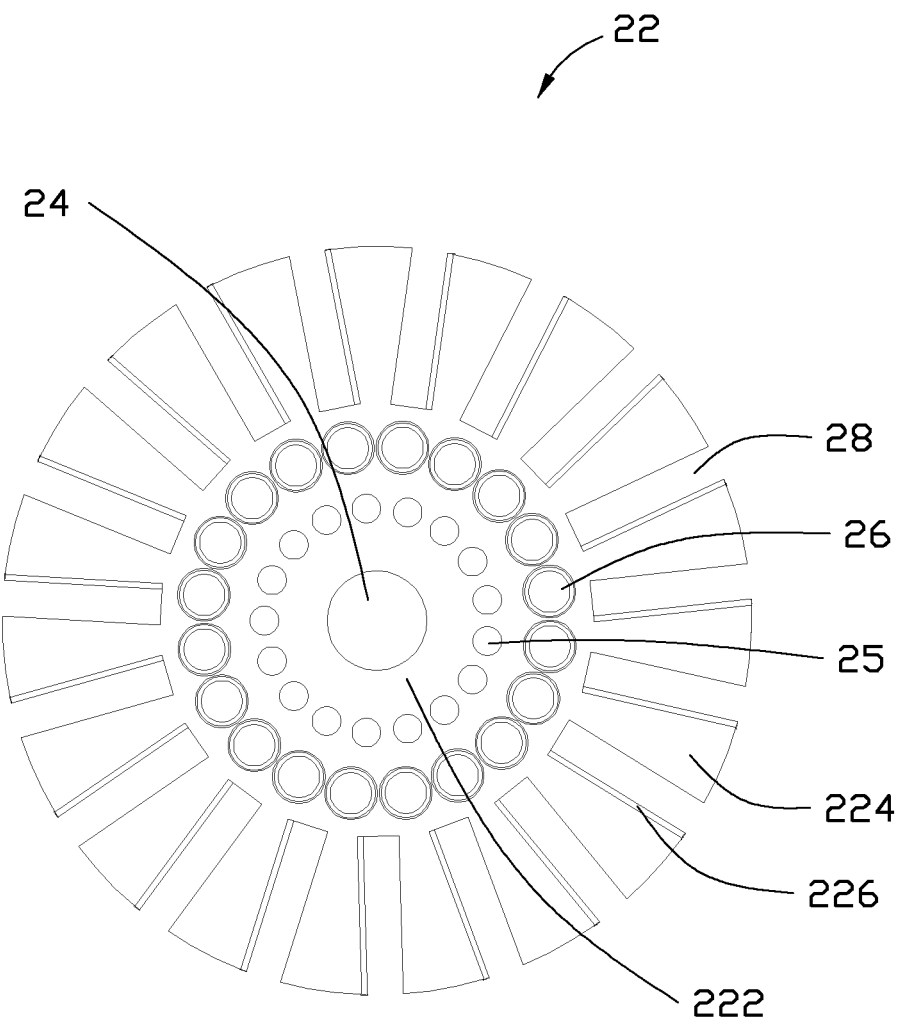
FIG. 4 is a top plan view of a topmost fin of the fin assembly of FIG. 3.

Also referring to FIGS. 3-4, the fin assembly 20 includes a plurality of fins 22 stacked together along a bottom-to-top direction. The fins 22 are spaced from each other. Each of the fins 22 is made of metal such as aluminum, copper or an alloy thereof, and defines a circular core hole 24 in a center thereof and a plurality of cutouts 28 surrounding the core hole 24. The cutouts 28 are defined from an outer edge of the fin 22 radially inward toward the core hole 24. The cutouts 28 are distributed in the fin 22 at regular angular intervals, so that the cutouts 28 divide the fin 22 into a circular body 222 and a plurality of truncated sector-shaped blades 224 arranged between the cutouts 28. Each blade 224 has an airflow guiding plate 226 extending vertically downwardly from a lateral side thereof. The airflow guiding plates 226 are formed on same sides of the blades 224. In the present embodiment, the airflow guiding plates 226 are formed on the counterclockwise-facing (counterclockwise-oriented) sides of the blades 224. A plurality of through holes 25 are defined in the body 222 of the fin 22, arranged in a circle surrounding the core hole 24. A plurality of connecting holes 26 are defined in the body 222 of the fin 22, arranged in a circle surrounding the circle of through holes 25. The circle of through holes 25 and the circle of connecting holes 26 are spaced from each other, and are concentric at a center of the core hole 24.

The fins 22 are not exactly the same as one another. In particular, for each two adjacent fins 22, the positions of the connecting holes 26 relative to the cutouts 28 differ slightly, and the positions of the through holes 25 relative to the cutouts 28 differ slightly. The differing positions enable the fins 22 to be stacked one on another such that in the stack, each of lines of multiple cutouts 28 one immediately above the other forms a gently spiralled pattern, and each of lines of multiple through holes 25 one immediately above the other forms a gently spiralled pattern (see also below).

In each fin 22, the number of cutouts 28, the number of through holes 25 and the number of connecting holes 26 meet the following linear relations. When the number of cutouts 28 is N, the number of through holes 25 is N±X, and the number of connecting holes 26 is N±Y. In addition, when X=Y, the plus or minus sign before X is either a plus sign or a minus sign, and the plus or minus sign before Y is either a minus sign or a plus sign and is the opposite of the sign before X. That is, when X=Y, the number of through holes 25 is N+X and the number of connecting holes 26 is N−Y; or the number of through holes 25 is N−X and the number of connecting holes 26 is N+Y. In this embodiment, the number of cutouts 28 is 19, the number of through holes 25 is 17, and the number of connecting holes 26 is 20 (see FIG. 4).

Each heat pipe 30 includes an evaporating section 32, and two condensing sections 34 extending vertically and upwardly from two ends of the evaporating section 32. The evaporating section 32 is received and soldered in a corresponding one of the grooves of the base 10.

The fan 40 is an axial flow fan, and includes a cylindrical frame 42 and an impeller 44 received in the frame 42. In the present embodiment, the impeller 44 rotates in a clockwise direction. The frame 42 has four upper flanges 46 and four lower flanges 48 extending outwardly from an outer periphery thereof. Each of the upper flanges 46 and the lower flanges 48 defines a through hole 400.

The holder 50 is made of material such as plastic, and includes a cylindrical body 52 and four fixing portions 54 evenly formed on an outer periphery of the body 52. Each fixing portion 54 includes an ear 56 extending outwardly from the body 52, and a pole 57 and a clasp 58 both extending vertically upwardly from a top face of the ear 56. Each pole 57 extends through the through hole 400 of a corresponding lower flange 48 of the fan 40, while the clasp 58 is pushed to deform by the lower flange 48 of the fan 40 and is thereby buckled on the lower flange 48. The body 52 of the holder 50 defines two opposite fixing holes (not labeled) therein. Two screws 522 extend through the fixing holes of the body 52 to fix the holder 50 on the fin assembly 20.

Referring to FIG. 3, in assembly of the fin assembly 20, the condensing sections 34 of the two heat pipes 30 extend upwardly through corresponding connecting holes 26 of the fins 22. In particular, each successive fin 22 threaded on the two heat pipes 30 and added to the stack of fins 22 has the connecting holes 26 angularly offset one connecting hole 26 in a counterclockwise (rightward) direction relative to the connecting holes 26 of a topmost fin 22 of the stack of fins 22. With this arrangement, the cutouts 28 of the successive fin 22 added to the stack are offset slightly counterclockwise (rightward) relative to the cutouts 28 of the topmost fin 22 of the stack, and the through holes 25 of the successive fin 22 are offset slightly counterclockwise (rightward) relative to the through holes 25 of the topmost fin 22.

That is, since the number of cutouts 28, the number of through holes 25 and the number of connecting holes 26 in each fin 22 meet the above linear relations, a plurality of spiral airflow guiding channels 280 each extending counterclockwise from bottom to top are cooperatively formed by the cutouts 28 at the outer periphery of the fin assembly 20 after all the fins 22 are assembled together. Correspondingly, the airflow guiding plates 226 of the fins 22 cooperatively form a plurality of spiral airflow guiding walls 228 each extending counterclockwise from bottom to top. Simultaneously, the through holes 25 of the fins 22 cooperatively form a plurality of spiral airflow guiding passages 250 each extending counterclockwise from bottom to top. Furthermore, the circular core holes 24 of the fins 22 cooperatively form a vertical airflow guiding passage 240.

The airflow guiding walls 228, the airflow guiding channels 280, the airflow guiding passages 250 and the airflow guiding passage 240 can guide air flowing from the fan 40 to flow smoothly downwards to the bottom of the fin assembly 20. In particular, when considering the fin assembly 20 from the top thereof to the bottom thereof, the clockwise, spiral extending directions of the airflow guiding walls 228, the airflow guiding channels 280 and the airflow guiding passages 250 are configured to be in accordance with the direction of the airflow from the fan 40, so that a flow resistance of the air flowing through the fin assembly 20 is effectively reduced. Moreover, the clockwise, spiral extension directions of the airflow guiding channels 280 and the airflow guiding passages 250 increase the contact area between the airflow and the fin assembly 20, and thereby more heat of the fin assembly 20 can be taken away by the airflow.

In alternative embodiments, the extending directions of the airflow guiding walls 228, the airflow guiding channels 280 and the airflow guiding passages 250 can be counterclockwise, according to an alternative rotating direction of the impeller 44 of the fan 40. In particular, in such embodiments, each of the airflow guiding channels 280 spirals somewhat from the top to the bottom of the fin assembly 20 in a counterclockwise direction, with the impeller 44 of the fan 40 rotating in the counterclockwise direction.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation apparatus comprising:
a plurality of fins each comprising a body and a plurality of blades extending radially outwardly from the body, the blades defining a plurality of cutouts therebetween, the fins being stacked together in such a manner that the cutouts of the fins cooperatively form a plurality of airflow guiding channels each extending spirally from top to bottom, each of the blades having an airflow guiding plate extending vertically downwardly from a lateral side thereof, the airflow guiding plates of the fins forming a plurality of airflow guiding walls each extending spirally from top to bottom.

2. The heat dissipation apparatus of claim 1, wherein a plurality of connecting holes are defined in the body of the fin, and the connecting holes are located along a same imaginary circle.

3. The heat dissipation apparatus of claim 2, wherein each fin defines a circular core hole in a center of the body, and the circular core holes of all the fins cooperatively form a vertical airflow guiding passage.

4. The heat dissipation apparatus of claim 3, wherein a plurality of through holes are defined in the body of each fin and are located between the core hole and the circle of connecting holes, the through holes are located along a same imaginary circle, and the through holes of all the fins cooperatively form a plurality of airflow guiding passages each extending spirally from top to bottom.

5. The heat dissipation apparatus of claim 4, wherein the circle of through holes and the circle of connecting holes are concentric at a center of the core hole.

6. The heat dissipation apparatus of claim 4, further comprising a fan placed above the plurality of fins, wherein the spiral extending directions of the airflow guiding walls, the airflow guiding channels and the airflow guiding passages are configured to be in accordance with the direction of airflow generated from the fan.

7. The heat dissipation apparatus of claim 6, further comprising a holder fixing the fan on the plurality of fins, wherein the holder comprises a cylindrical body and a plurality of fixing portions evenly formed on an outer periphery of the body, each fixing portion comprising an ear extending outwardly from the body, and a pole extending vertically upwardly from a top face of the ear, the fan comprising a plurality of lower flanges extending outwardly from an outer periphery thereof, each of the lower flanges defining a through hole, each pole extending through the through hole of a corresponding lower flange of the fan.

8. The heat dissipation apparatus of claim 7, wherein each fixing portion further comprises a clasp extending vertically upwardly from the top face of the ear, the clasp being pushed to deform by the lower flange of the fan and thereby buckled on the lower flange.

9. The heat dissipation apparatus of claim 2, further comprising a heat pipe, the heat pipe comprising a condensing section extending through corresponding connecting holes of the fins.

10. The heat dissipation apparatus of claim 1, wherein each of the blades is sector-shaped.

* * * * *